(12) United States Patent
Walker et al.

(10) Patent No.: US 11,028,954 B2
(45) Date of Patent: Jun. 8, 2021

(54) ACCUMULATOR HAVING A DIAPHRAGM OR BLADDER WITH A METALLIZED BARRIER FILM

(71) Applicant: Freudenberg-NOK General Partnership, Plymouth, MI (US)

(72) Inventors: Joe Walker, Tecumseh, MI (US); Paul J. Hochgesang, Ann Arbor, MI (US); Nate Tuckerman, Plymouth, MI (US)

(73) Assignee: Freudenberg-NOK General Partnership, Plymouth, MI (US)

( * ) Notice: Subject to any disclaimer, the term of this patent is extended or adjusted under 35 U.S.C. 154(b) by 118 days.

(21) Appl. No.: 16/447,070

(22) Filed: Jun. 20, 2019

(65) Prior Publication Data

US 2020/0400262 A1 Dec. 24, 2020

(51) Int. Cl.
| | | |
|---|---|---|
| *F16L 55/053* | (2006.01) | |
| *B32B 7/12* | (2006.01) | |
| *B32B 25/08* | (2006.01) | |
| *C23C 14/20* | (2006.01) | |

(52) U.S. Cl.
CPC .............. *F16L 55/053* (2013.01); *B32B 7/12* (2013.01); *B32B 25/08* (2013.01); *C23C 14/20* (2013.01); *B32B 2255/10* (2013.01); *B32B 2255/205* (2013.01); *B32B 2307/7242* (2013.01); *B32B 2307/732* (2013.01)

(58) Field of Classification Search
CPC ............ F16L 55/053; F16L 55/04; B32B 3/00
USPC ..................................... 138/30, 26; 428/35.7
See application file for complete search history.

(56) References Cited

U.S. PATENT DOCUMENTS

| | | | |
|---|---|---|---|
| 3,526,580 A | | 9/1970 | Webb |
| 4,880,213 A | | 11/1989 | Shinbori et al. |
| 5,054,373 A | | 10/1991 | Brault et al. |
| 5,117,873 A | | 6/1992 | Miyakawa et al. |
| 5,133,387 A | | 7/1992 | Pietrykowski et al. |
| 5,215,124 A | | 6/1993 | Hattori et al. |
| 5,409,041 A | | 4/1995 | Yoshida et al. |
| 5,618,629 A | * | 4/1997 | Takamatsu ............... B32B 27/34 138/141 |
| 5,732,741 A | * | 3/1998 | Shiery ................. F16L 55/0338 138/30 |
| 6,016,841 A | | 1/2000 | Larsen |
| 6,058,976 A | * | 5/2000 | Le Rossignol ......... B32B 27/08 138/26 |
| 6,092,552 A | * | 7/2000 | Takamatsu .............. B32B 25/18 138/30 |

(Continued)

FOREIGN PATENT DOCUMENTS

EP    0927631 A1    7/1999

OTHER PUBLICATIONS

Extended European Search Report dated Dec. 3, 2020 (corresponding to EP20179135.7).

*Primary Examiner* — Patrick F Brinson
(74) *Attorney, Agent, or Firm* — Daniel J. Sepanik, Esq.; Harness, Dickey & Pierce, P.L.C.

(57) ABSTRACT

A diaphragm and a bladder for an accumulator each include a thermoplastic film formed in a dome or bulbous shape. A metallic vapor deposition layer is disposed on at least one side of the thermoplastic. Inner and outer rubber layers are adhered on opposite sides of the metallic coated film so that the metallized thermoplastic film provides a barrier film to effectively slow the permeation of a gas such as nitrogen through the diaphragm or bladder.

12 Claims, 4 Drawing Sheets

(56) References Cited

U.S. PATENT DOCUMENTS

| | | | |
|---|---|---|---|
| 6,620,472 B1 | 9/2003 | Shepard et al. | |
| 7,121,304 B2 | 10/2006 | Gray, Jr. | |
| 2005/0031816 A1* | 2/2005 | Chang | B32B 25/08 |
| | | | 428/35.7 |
| 2010/0209672 A1* | 8/2010 | Hodjat | F24D 3/1016 |
| | | | 428/172 |
| 2016/0023381 A1 | 1/2016 | Mazabraud et al. | |

* cited by examiner

ACCUMULATOR HAVING A DIAPHRAGM OR BLADDER WITH A METALLIZED BARRIER FILM

FIELD

The present disclosure relates to an accumulator having a diaphragm or bladder with a metallized barrier film.

BACKGROUND

This section provides background information related to the present disclosure which is not necessarily prior art.

Accumulators are commonly used in hydraulic systems as a pressure storage reservoir in which a non-compressible hydraulic fluid is held under pressure by an external source. The external source can be a spring, a raised weight, or a compressed gas. When a compressed gas is used as a spring source, a diaphragm or bladder is typically used between the compressed gas and the hydraulic fluid. A concern with using compressed gas is that the gas can permeate through the diaphragm or bladder and the gas needs to be periodically recharged.

SUMMARY

This section provides a general summary of the disclosure, and is not a comprehensive disclosure of its full scope or all of its features.

A diaphragm for an accumulator includes a thermoplastic film formed in a dome shape. A metallic vapor deposition layer is disposed on at least one side of the dome shaped thermoplastic film to form a metallic coated dome shaped film. Inner and outer rubber layers are adhered on opposite sides of the metallic coated dome shaped film. The metallized thermoplastic film provides a barrier film to effectively slow the permeation of a gas such as nitrogen through the diaphragm.

According to a further aspect, a bladder for an accumulator includes a thermoplastic film formed in a bulbous shape. A metallic vapor deposition layer is disposed on at least one side of the bulbous shaped thermoplastic film to form a metallic coated predetermined shaped film. The film shape can be dome-shaped or shaped to correspond with other bladders or diaphragms. Inner and outer rubber layers are adhered on opposite sides of the metallic coated predetermined shaped film. The metallized thermoplastic film provides a barrier film to effectively slow the permeation of a gas such as nitrogen through the bladder.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Figure 1:
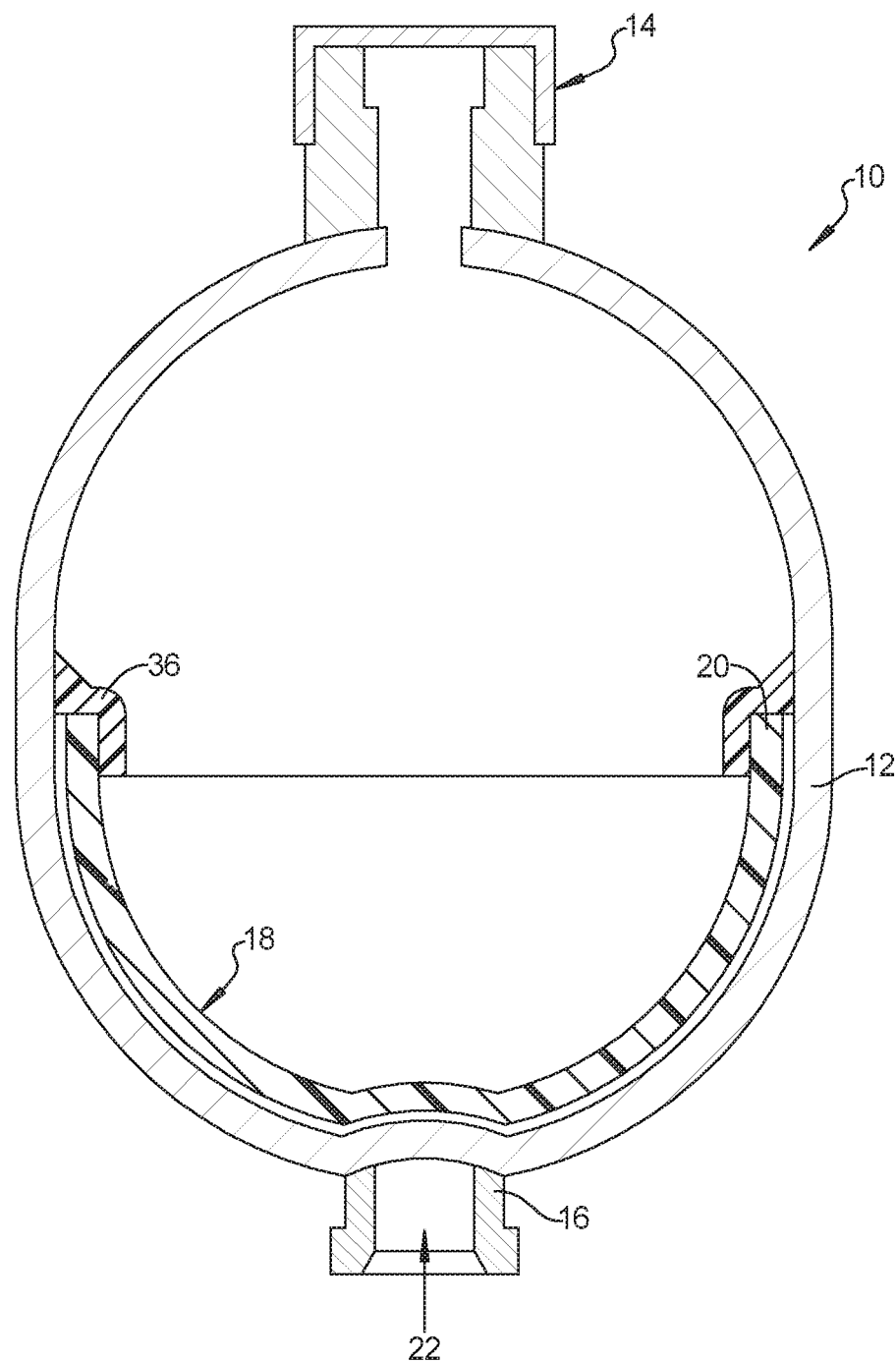
FIG. 1 is a cross-sectional view of an exemplary diaphragm accumulator according to the principles of the present disclosure.

With reference to FIG. 1, a diaphragm-type accumulator 10 is shown including a shell 12 having a charging valve 14 at a first end and a fluid port 16 at a second end. A dome-shaped diaphragm 18 is disposed within the shell 12 and includes an outer periphery edge 20 sealingly attached to the shell 12 by a clamp ring 36. A pressurized gas such as nitrogen is typically introduced through the charging valve 14 to apply a pressure against an internal surface of the diaphragm 18. A hydraulic fluid system 22 is connected to the fluid port 16 of the accumulator 10.

Figure 2A:
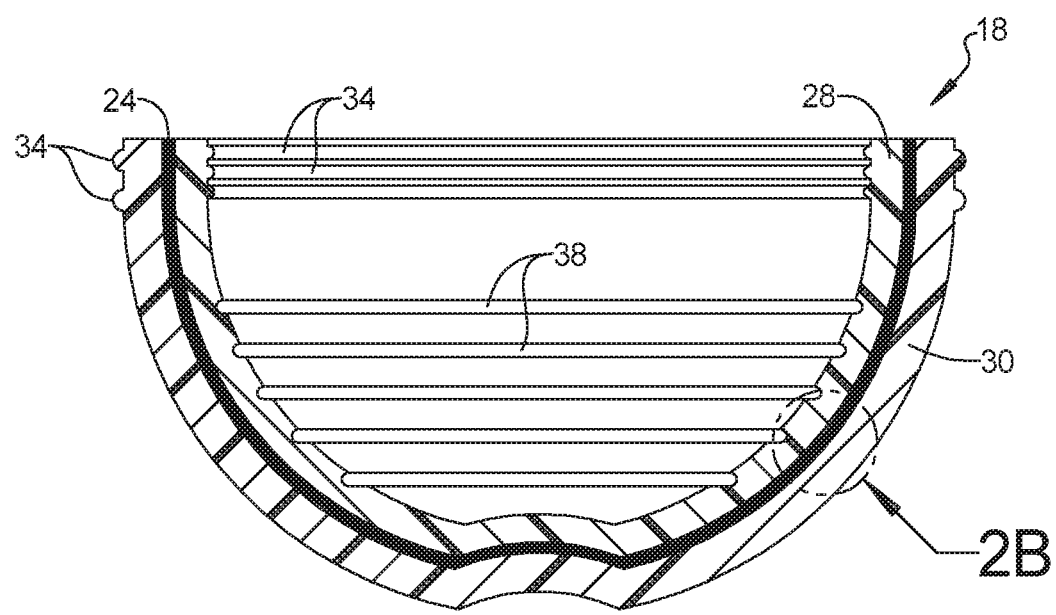
FIG. 2A is a cross-sectional view of the diaphragm according to the principles of the present disclosure.
Figure 2B:
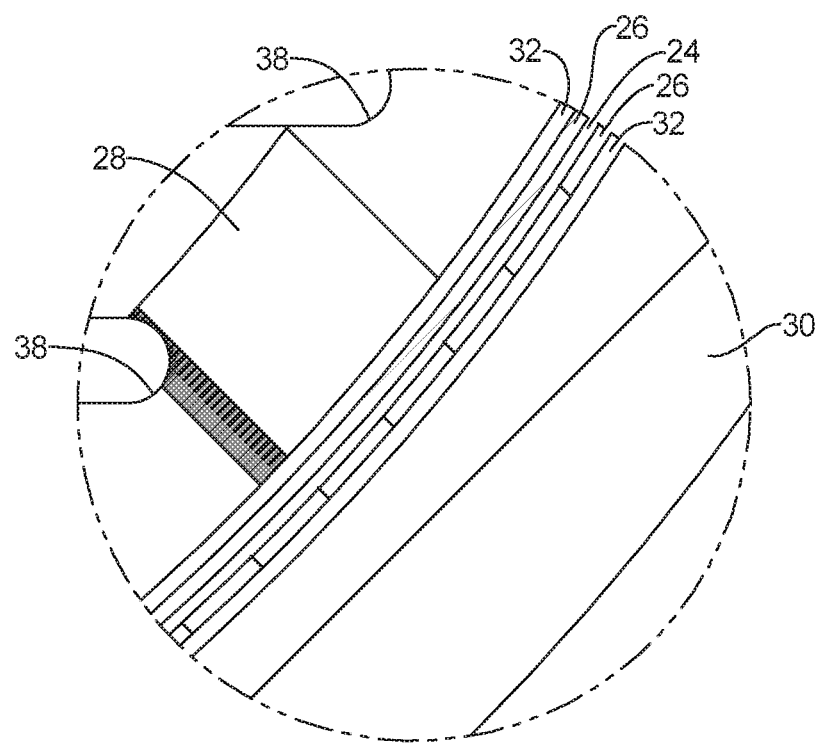
FIG. 2B is an enlarged view of the indicated portion of FIG. 2A according to the principles of the present disclosure.

With reference to FIG. 2, the diaphragm 18 includes a thermoplastic film 24 formed in a dome shape. More particularly, the thermoplastic film can be formed from polychlorotrifluoroethylene (PCTFE), FEP, CTFE (commercial name ACLAR), ECTFE (commercial name HALAR), PVF (commercial name TEDLAR), EvOH containing laminates with polyamides, fluorocarbon film laminates with polyesters or other thermoplastic material. A metallic vapor deposition layer 26 is disposed on at least one side of the dome shaped thermoplastic film 24 to form a metallic coated dome shaped film. The metallic vapor deposition layer 26 can be applied to the inner and the outer surfaces of the dome shaped thermoplastic film 24. An inner layer of rubber 28 and an outer layer of rubber 30 are adhered on opposite sides of the metallic coated dome-shaped film 24. The inner and outer layers of rubber can include, for example, silicone rubber, fluorocarbon rubber or hydrogenated nitrile butadiene rubber (HNBR). An adhesive layer 32 can be used to adhere the inner and outer rubber layers 28, 30 to the metallic coated dome-shaped film 24. The adhesive layer 32 can include a silane or epoxy-based adhesive, although other types of adhesives can be used. The inner and outer rubber layers 28, 30 can be pre-formed or molded directly to the metallic coated dome-shaped film 24 which can be pre-coated with the adhesive 32. The inner and/or outer rubber layers 28, 30 can be provided with annular grooves or ribs 38 that provide flex regions for the diaphragm 18.

The thermoplastic film 24 can be between 4 and 8 mils thick and more particularly about 6 mils thick. The metallic vapor deposition layer 26 can include aluminum or another metal and can be between 1500 and 5000 angstroms thick. The inner and outer rubber layers 28, 30 can have an average thickness of be between 1 mm and 5 mm thick and more particularly about 2 mm thick. The inner and outer rubber layers 28, 30 can include inner and outer sealing beads or features 34 that aid in sealing the diaphragm 18 between the clamp ring 36 and an inner surface of the shell 12. The inner and outer rubber layers 28, 30 can include polyurethanes, HNBR, silicone rubber, fluorocarbon rubber and ECO rubbers.

The metallized thermoplastic film 24/26 provides a barrier film to effectively slow the permeation of a gas such as nitrogen through the diaphragm 18.

Figure 3:
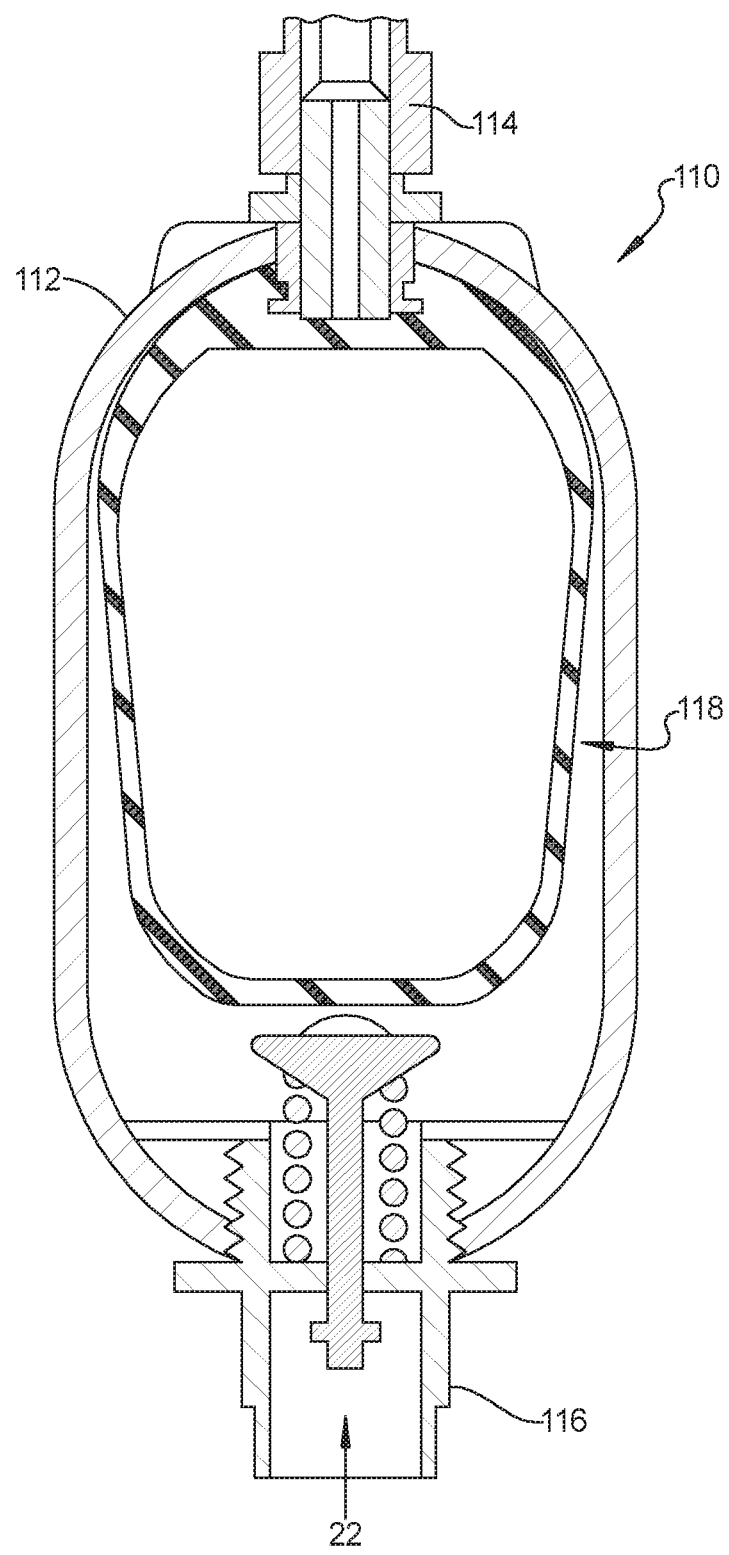
FIG. 3 is a cross-sectional view of an exemplary bladder accumulator according to the principles of the present disclosure.

With reference to FIG. 3, a bladder-type accumulator 110 is shown including a shell 112 having a charging valve 114 at a first end and a fluid port 116 at a second end. A bladder 118 is disposed within the shell 112 and includes an outer periphery edge 120 sealingly attached to the shell 112. A pressurized gas such as nitrogen is typically introduced through the charging valve 114 to apply a pressure inside of the bladder 118. A hydraulic fluid system 22 is connected to the fluid port 116 of the accumulator 110.

Figure 4A:
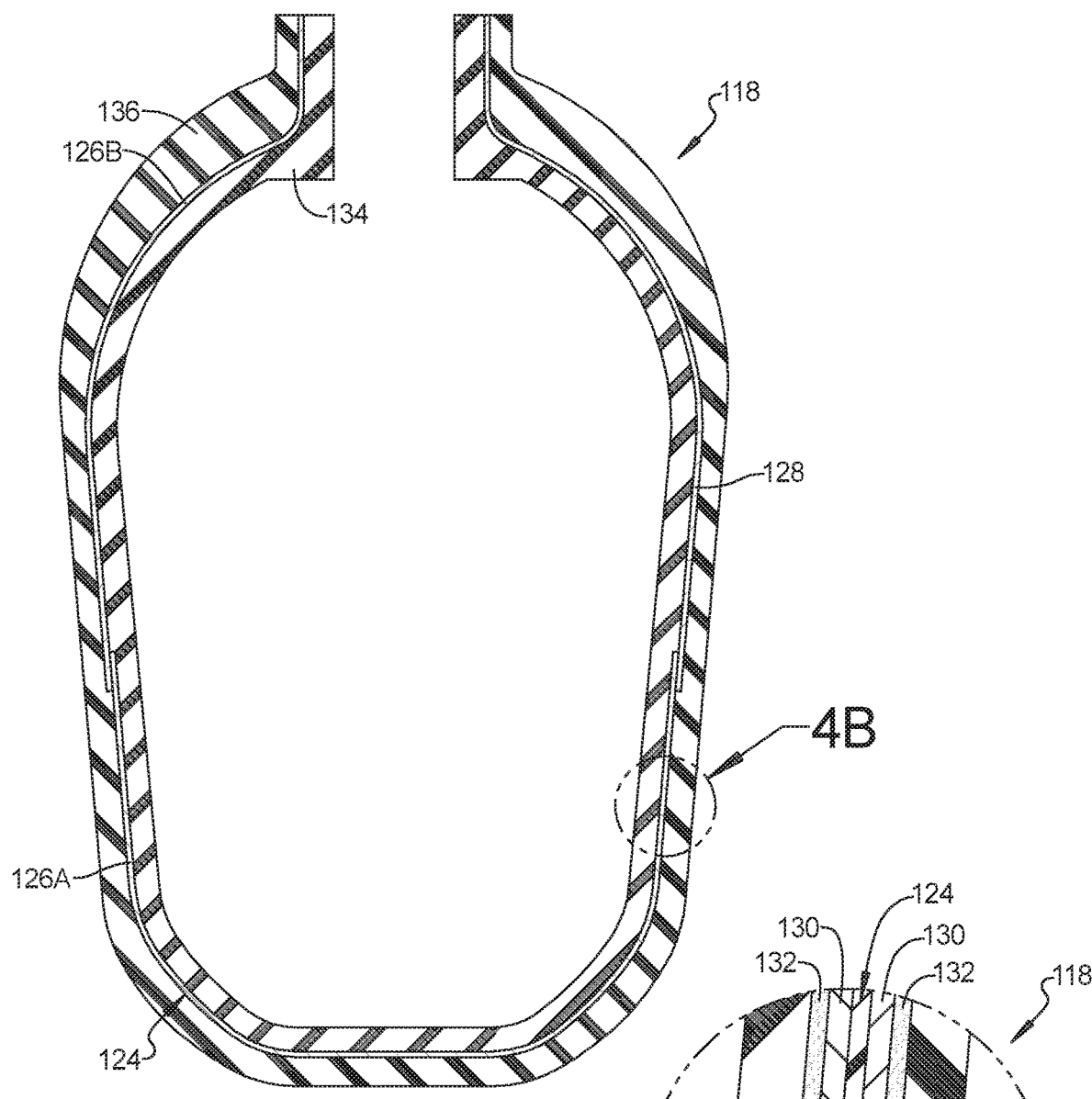
FIG. 4A is a cross-sectional view of the bladder according to the principles of the present disclosure.
Figure 4B:
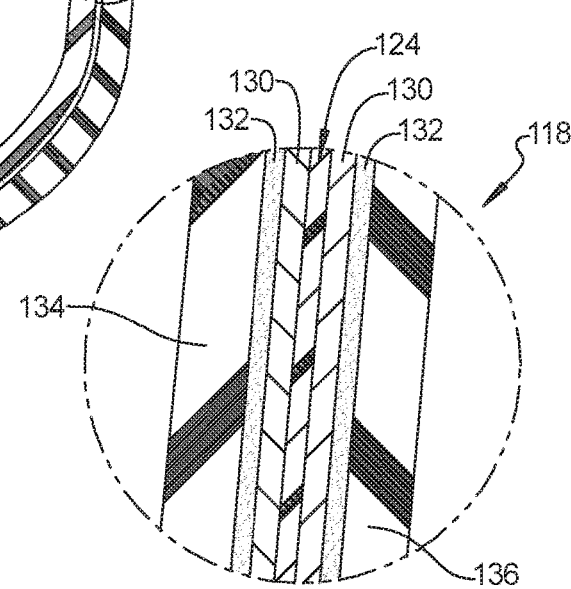
FIG. 4B is an enlarged view of the indicated portion of FIG. 4A according to the principles of the present disclosure.

With reference to FIG. 4, the bladder 118 includes a thermoplastic film 124 formed in a bulbous shape. More particularly, the thermoplastic film 124 can be formed from polychlorotrifluoroethylene (PCTFE) or other thermoplastic material. The bulbous shape can be formed from multiple parts including two dome shaped portions 126a, 126B that can be adhered to one another by an adhesive 128. It should be understood that the bulbous shaped film 124 could be formed in other ways. A metallic vapor deposition layer 130 is disposed on at least one side of the bulbous shaped film 124. The metallic vapor deposition layer 130 can be applied to the inner and the outer surfaces of the bulbous-shaped thermoplastic film 124. A pair of rubber layers 134, 136 are adhered on opposite sides of the metallic coated bulbous-shaped film 124. An adhesive layer 132 can be provided for adhering the rubber layers 134, 136 to the metallic coated bulbous-shaped film 124 and can include a silane or epoxy-based adhesive 132. The inner and outer rubber layers 134, 136 can be pre-formed or molded directly to the metallic coated bulbous-shaped film 124 which can be pre-coated with the adhesive 132.

The thermoplastic film 124 can be between 4 and 8 mils thick and more particularly about 6 mils thick. The metallic vapor deposition layer 130 can include aluminum or another metal and can be between 1500 and 5000 angstroms thick. The inner and outer rubber layers 134, 136 can be between 1 mm and 10 mm thick and more particularly about 3 mm thick.

The metallized thermoplastic film 124/130 provides a barrier film to effectively slow the permeation of a gas such as nitrogen through the bladder 118.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A diaphragm for an accumulator, comprising:
   a thermoplastic film formed in a defined shape, wherein the thermoplastic film has a thickness of between 4 and 8 mils;
   a metallic layer disposed on both sides of the thermoplastic film to form a metallic coated film; and
   inner and outer rubber layers adhered on opposite sides of the metallic coated film.

2. The diaphragm according to claim 1, wherein the thermoplastic film is made from one of polychlorotrifluoroethylene, FEP, CTFE, ECTFE, PVF, EvOH containing laminates with polyamides, and fluorocarbon film laminates with polyesters.

3. The diaphragm according to claim 1, wherein the inner and outer rubber layers are adhered to the metallic coated film by an adhesive.

4. The diaphragm according to claim 1, wherein the metallic layer disposed on the dome-shaped thermoplastic film has a thickness of between 1500 and 5000 angstroms.

5. The diaphragm according to claim 1, wherein the metallic layer is made from aluminum.

6. The diaphragm according to claim 1, wherein each of the inner and outer rubber layers are made from one of a polyurethane, HNBR, silicone rubber, fluorocarbon rubber, and ECO rubber.

7. A bladder for an accumulator, comprising:
   a thermoplastic film formed in a bulbous-shape, wherein the thermoplastic film has a thickness of between 4 and 8 mils;
   a metallic layer disposed on both sides of the bulbous-shaped thermoplastic film to form a metallic coated bulbous-shaped film; and
   inner and outer rubber layers adhered on opposite sides of the metallic coated bulbous-shaped thermoplastic film.

8. The bladder according to claim 7, wherein the thermoplastic film is made from one of polychlorotrifluoroethylene, FEP, CTFE, ECTFE, PVF, EvOH containing laminates with polyamides, and fluorocarbon film laminates with polyesters.

9. The bladder according to claim 7, wherein the inner and outer rubber layers are adhered to the metallic coated bulbous-shaped film by an adhesive.

10. The bladder according to claim 7, wherein the metallic layer disposed on the dome-shaped thermoplastic film has a thickness of between 1500 and 5000 angstroms.

11. The bladder according to claim 7, wherein the metallic layer is made from aluminum.

12. The bladder according to claim 7, wherein the inner and outer rubber layers are made from one of a polyurethane, HNBR, silicone rubber, flourocarbon rubber and ECO rubber.

\* \* \* \* \*